United States Patent
Hiraiwa et al.

(10) Patent No.: US 8,691,602 B2
(45) Date of Patent: Apr. 8, 2014

(54) METHOD FOR PRODUCING SEMICONDUCTOR LIGHT-EMITTING CHIP

(75) Inventors: Daisuke Hiraiwa, Ichihara (JP); Takehiko Okabe, Ichihara (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 3 days.

(21) Appl. No.: 13/447,590

(22) Filed: Apr. 16, 2012

(65) Prior Publication Data

US 2012/0261678 A1 Oct. 18, 2012

(30) Foreign Application Priority Data

Apr. 15, 2011 (JP) ................................. 2011-090590

(51) Int. Cl.
*H01L 21/00* (2006.01)

(52) U.S. Cl.
USPC ............................... 438/28; 438/462; 257/79

(58) Field of Classification Search
USPC ........................ 438/28, 462; 257/79, E33.056
See application file for complete search history.

(56) References Cited

U.S. PATENT DOCUMENTS

| | | |
|---|---|---|
| 2004/0002199 A1 | 1/2004 | Fukuyo et al. |
| 2005/0173387 A1 | 8/2005 | Fukuyo et al. |
| 2005/0181581 A1 | 8/2005 | Fukuyo et al. |
| 2005/0184037 A1 | 8/2005 | Fukuyo et al. |
| 2005/0189330 A1 | 9/2005 | Fukuyo et al. |
| 2005/0194364 A1 | 9/2005 | Fukuyo et al. |
| 2006/0040473 A1 | 2/2006 | Fukuyo et al. |
| 2006/0160331 A1 | 7/2006 | Fukuyo et al. |
| 2010/0025684 A1 | 2/2010 | Shinohara et al. |
| 2010/0055876 A1 | 3/2010 | Fukuyo et al. |
| 2010/0081256 A1* | 4/2010 | Uemura et al. ............... 438/462 |
| 2010/0102360 A1* | 4/2010 | Nakada et al. ................ 257/201 |
| 2010/0176100 A1 | 7/2010 | Fukuyo et al. |
| 2011/0021004 A1 | 1/2011 | Fukuyo et al. |
| 2011/0027971 A1 | 2/2011 | Fukuyo et al. |
| 2011/0027972 A1 | 2/2011 | Fukuyo et al. |
| 2011/0037149 A1 | 2/2011 | Fukuyo et al. |
| 2011/0204412 A1* | 8/2011 | Sugano ......................... 257/103 |
| 2012/0228276 A1* | 9/2012 | Fukuyo et al. ........... 219/121.72 |

FOREIGN PATENT DOCUMENTS

| | | |
|---|---|---|
| JP | 2005-159378 A | 6/2005 |
| JP | 2005-252245 A | 9/2005 |
| JP | 2009-123717 A | 6/2009 |

* cited by examiner

*Primary Examiner* — Phuc Dang
(74) *Attorney, Agent, or Firm* — Sughrue Mion, PLLC

(57) ABSTRACT

In producing a semiconductor light-emitting chip whose substrate is composed of a sapphire single crystal, cracking in semiconductor light-emitting elements in the obtained semiconductor light-emitting chip is suppressed. A semiconductor light-emitting chip is obtained by forming, on an element-group formation substrate on a front surface of which semiconductor light-emitting elements are formed, the front surface being composed of a C-plane of a sapphire single crystal, dividing grooves extending toward a first direction along an M-plane of the sapphire single crystal and the front surface of the substrate from a substrate front surface side (step 103), forming first modified regions extending toward the first direction and second modified regions extending along the substrate front surface and toward a second direction different from the first direction in the substrate (step 104 and step 105), and dividing the element-group formation substrate using the first modified regions and the second modified regions (step 106).

12 Claims, 9 Drawing Sheets

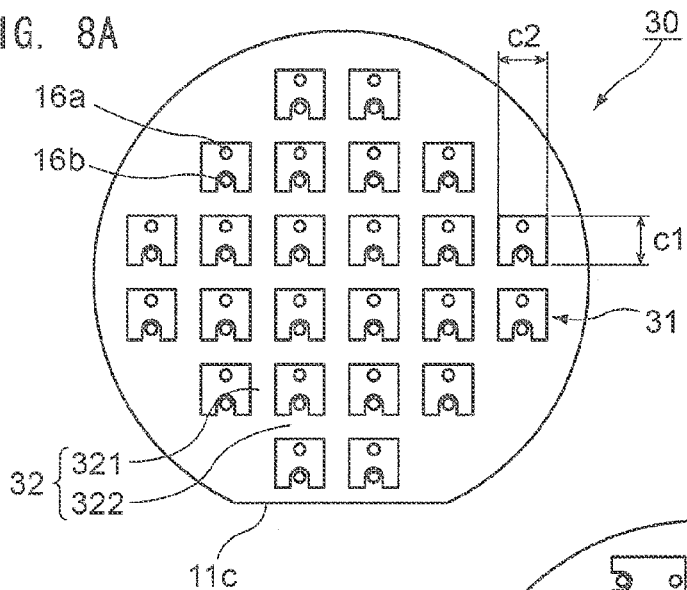
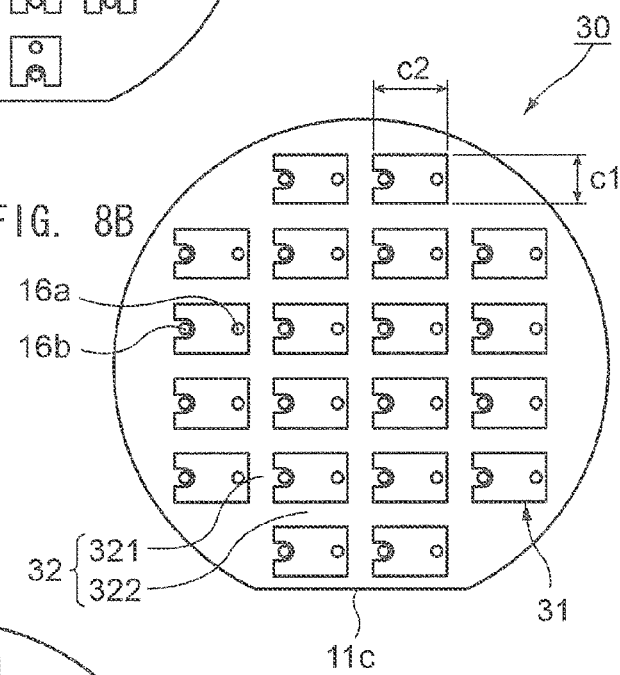
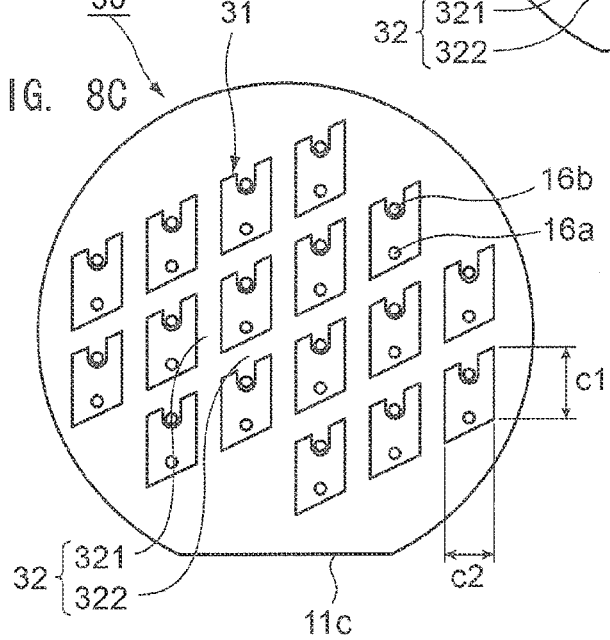

Fig. 9

| | CONFIGURATION OF LIGHT-EMITTING CHIP | | | PROCESSING CONDITIONS OF ELEMENT-GROUP FORMATION SUBSTRATE | | | | | | RESULTS OF DIVISION |
|---|---|---|---|---|---|---|---|---|---|---|
| | THICKNESS OF LIGHT-EMITTING CHIP (μm) | FIRST LENGTH c1 (μm) | SECOND LENGTH c2 (μm) | WIDTH OF GROOVE PORTION | | DIVIDING GROOVES 41 FORMED IN FIRST GROOVE PORTIONS 321** | | DEPTH OF MODIFIED REGION | | INCIDENCE OF DEFECTIVE (NG) CASES (%) |
| | | | | n1 (μm) | n2 (μm) | | DEPTH (μm) | D1 (μm) | D2 (μm) | |
| EXAMPLE 1 | 150 | 400 | 240 | 20 | 30 | PRESENT | 20 | 30 | 100 | 0.15 |
| EXAMPLE 2 | 150 | 400 | 240 | 20 | 20 | PRESENT | 20 | 30 | 100 | 0.45 |
| EXAMPLE 3 | 150 | 400 | 240 | 30 | 30 | PRESENT | 20 | 30 | 100 | 0.40 |
| EXAMPLE 4 | 150 | 350 | 350 | 20 | 30 | PRESENT | 15 | 30 | 100 | 0.30 |
| EXAMPLE 5 | 150 | 240 | 400 | 20 | 30 | PRESENT | 15 | 30 | 100 | 0.25 |
| COMPARATIVE EXAMPLE 1 | 150 | 400 | 240 | 20 | 20 | ABSENT | — | 30 | 100 | 9.50 |
| COMPARATIVE EXAMPLE 2 | 150 | 400 | 240 | 30 | 30 | ABSENT | — | 30 | 100 | 1.20 |

**DIVIDING GROOVES 41 ARE NOT FORMED IN SECOND GROOVE PORTIONS 322

METHOD FOR PRODUCING SEMICONDUCTOR LIGHT-EMITTING CHIP

CROSS-REFERENCE TO RELATED APPLICATIONS

This application is based on and claims priority under 35 USC §119 from Japanese Patent Application No. 2011-090590 filed Apr. 15, 2011.

BACKGROUND

1. Technical Field

The present invention relates to a method for producing a semiconductor light-emitting chip and a semiconductor light-emitting chip produced thereby.

2. Related Art

A method of obtaining a semiconductor light-emitting chip equipped with a semiconductor light-emitting element (hereinafter, referred to as a light-emitting chip) by dividing an element-group formation substrate, in which plural semiconductor light-emitting elements are formed on a substrate, into individual pieces is widely used.

As a related art, there is a technique for obtaining a light-emitting chip, in which a laser beam is focused on an interior of an element-group formation substrate and irradiation is performed along expected dividing lines assumed on the substrate to form a modified region having crystal strength lower than that before irradiation of laser beam, and thereafter, starting from the modified region, the element-group formation substrate is divided to obtain the light-emitting chip (refer to Japanese Patent Application Laid-Open Publication No. 2005-159378).

Further, there is disclosed a technique for increasing a number of chips that can be taken out from a single semiconductor wafer to improve productivity by, in a gallium nitride-based compound semiconductor wafer in which a gallium nitride-based compound semiconductor is laminated on a substrate made of a sapphire single crystal or the like, removing a part of the semiconductor to form a first dividing groove on the semiconductor and on a surface of the substrate on which the semiconductor is not laminated, forming a second dividing groove to face the first dividing groove (refer to Japanese Patent Application Laid-Open Publication No. 2005-252245).

However, in the case where the sapphire single crystal is used as the substrate, there has been a possibility that cracks occur in the semiconductor light-emitting element in the semiconductor light-emitting chip obtained by dividing the element-group formation substrate.

The present invention has been made in view of the above circumstances and has as an object to suppress cracking in semiconductor light-emitting elements in a semiconductor light-emitting chip obtained in production of the semiconductor light-emitting chip using a sapphire single crystal as a substrate.

SUMMARY

According to a first aspect of the present invention, a method for producing a semiconductor light-emitting chip includes: a dividing groove forming process for forming plural dividing grooves on a semiconductor lamination substrate, in which a semiconductor layer containing a group III nitride semiconductor is laminated on a front surface of a sapphire substrate having the front surface and a back surface, the front surface being composed of a C-plane of a sapphire single crystal constituting the sapphire substrate, the plural dividing grooves being formed in a first direction along an M-plane of the sapphire single crystal and the front surface of the sapphire substrate from a side on which the semiconductor layer is laminated; a modified region forming process for forming, in the sapphire substrate, plural first modified regions extending toward the first direction and plural second modified regions extending along the front surface of the sapphire substrate and toward a second direction different from the first direction by irradiating the semiconductor lamination substrate, on which the plural dividing grooves are formed, with laser light from a side of the back surface; and a dividing process for dividing the semiconductor lamination substrate, in which the plural first modified regions and the plural second modified regions are formed, by use of the plural first modified regions and the plural second modified regions.

According to a second aspect of the present invention, in the method for producing a semiconductor light-emitting chip of the first aspect, in the dividing groove forming process, any dividing groove extending toward the second direction is not formed on the semiconductor lamination substrate from the side on which the semiconductor layer is laminated.

According to a third aspect of the present invention, in the method for producing a semiconductor light-emitting chip of the second aspect, the method further includes a groove portion forming process for forming plural first groove portions extending toward the first direction and plural second groove portions extending toward the second direction on the semiconductor layer by removing part of the semiconductor layer along the first direction and the second direction from the side on which the semiconductor layer is laminated, the groove portion forming process being prior to the dividing groove forming process, wherein, in the dividing groove forming process, each of the plural dividing grooves is formed in each of the plural first groove portions, and in the modified region forming process, each of the plural first modified regions is formed to overlap each of the plural first groove portions in a depth direction of the sapphire substrate by performing irradiation of the laser light along each of the plural first groove portions, and each of the plural second modified regions is formed to overlap each of the plural second groove portions in the depth direction of the sapphire substrate by performing irradiation of the laser light along each of the plural second groove portions.

According to a fourth aspect of the present invention, in the method for producing a semiconductor light-emitting chip of the third aspect, the modified region forming process includes: a second modified region forming process for forming the plural second modified regions in the semiconductor lamination substrate on which the plural dividing grooves have been formed; and a first modified region forming process for forming the plural first modified regions in the semiconductor lamination substrate in which the plural second modified regions have been formed, the second modified region forming process and the first modified region forming process being performed in this order.

According to a fifth aspect of the present invention, in the method for producing a semiconductor light-emitting chip of the fourth aspect, in the modified region forming process, each of the plural second modified regions is formed at a position whose depth from the back surface of the sapphire substrate is a second depth, and each of the plural first modified regions is formed at a position whose depth from the back surface of the sapphire substrate is a first depth that is shallower than the second depth.

According to a sixth aspect of the present invention, in the method for producing a semiconductor light-emitting chip of the fifth aspect, in the modified region forming process, intensity of the laser light in forming the plural first modified regions is set lower than intensity of the laser light in forming the plural second modified regions.

According to a seventh aspect of the present invention, in the method for producing a semiconductor light-emitting chip of the sixth aspect, in the modified region forming process, intervals between adjacent ones of the plural first modified regions are set closer than intervals between adjacent ones of the plural second modified regions.

According to an eighth aspect of the present invention, in the method for producing a semiconductor light-emitting chip of the seventh aspect, in the dividing process, the semiconductor lamination substrate in which the plural first modified regions and the plural second modified regions are formed is divided by use of the plural second modified regions, and thereafter, divided by use of the plural first modified regions.

According to a ninth aspect of the present invention, in the method for producing a semiconductor light-emitting chip of the first aspect, the method further includes a groove portion forming process for forming plural first groove portions extending toward the first direction and plural second groove portions extending toward the second direction on the semiconductor layer by removing part of the semiconductor layer along the first direction and the second direction from the side on which the semiconductor layer is laminated, the groove portion forming process being prior to the dividing groove forming process, wherein, in the dividing groove forming process, each of the plural dividing grooves is formed in each of the plural first groove portions, and in the modified region forming process, each of the plural first modified regions is formed to overlap each of the plural first groove portions in a depth direction of the sapphire substrate by performing irradiation of the laser light along each of the plural first groove portions, and each of the plural second modified regions is formed to overlap each of the plural second groove portions in the depth direction of the sapphire substrate by performing irradiation of the laser light along each of the plural second groove portions.

According to a tenth aspect of the present invention, in the method for producing a semiconductor light-emitting chip of the ninth aspect, the modified region forming process includes: a second modified region forming process for forming the plurality of second modified regions in the semiconductor lamination substrate on which the plural dividing grooves have been formed; and a first modified region forming process for forming the plural first modified regions in the semiconductor lamination substrate in which the plural second modified regions have been formed, the second modified region forming process and the first modified region forming process being performed in this order.

According to an eleventh aspect of the present invention, in the method for producing a semiconductor light-emitting chip of the first aspect, the modified region forming process includes: a second modified region forming process for forming the plural second modified regions in the semiconductor lamination substrate on which the plural dividing grooves have been formed; and a first modified region forming process for forming the plural first modified regions in the semiconductor lamination substrate in which the plural second modified regions have been formed, the second modified region forming process and the first modified region forming process being performed in this order.

According to a twelfth aspect of the present invention, in the method for producing a semiconductor light-emitting chip of the first aspect, in the modified region forming process, each of the plural second modified regions is formed at a position whose depth from the back surface of the sapphire substrate is a second depth, and each of the plural first modified regions is formed at a position whose depth from the back surface of the sapphire substrate is a first depth that is shallower than the second depth.

According to a thirteenth aspect of the present invention, in the method for producing a semiconductor light-emitting chip of the first aspect, in the modified region forming process, intensity of the laser light in forming the plural first modified regions is set lower than intensity of the laser light in forming the plural second modified regions.

According to a fourteenth aspect of the present invention, in the method for producing a semiconductor light-emitting chip of the first aspect, in the modified region forming process, intervals between adjacent ones of the plural first modified regions are set closer than intervals between adjacent ones of the plural second modified regions.

According to a fifteenth aspect of the present invention, in the method for producing a semiconductor light-emitting chip of the first aspect, in the dividing process, the semiconductor lamination substrate in which the plural first modified regions and the plural second modified regions are formed is divided by use of the plural second modified regions, and thereafter, divided by use of the plural first modified regions.

According to a sixteenth aspect of the present invention, a semiconductor light-emitting chip includes: a sapphire substrate that includes a front surface and a back surface, each of which has four sides and shows a quadrangular shape, and four side surfaces formed to enclose a limb of the four sides of the front surface and a limb of the four sides of the back surface by connecting each side of the front surface and each side of the back surface in a one-to-one relationship, the four side surfaces including two first side surfaces facing each other and two second side surfaces facing each other; and a semiconductor layer that contains a group III nitride semiconductor and is laminated on the front surface of the sapphire substrate, wherein the front surface of the sapphire substrate is formed along a C-plane of a sapphire single crystal constituting the sapphire substrate, each of the two first side surfaces has a rising surface that rises along an M-plane of the sapphire single crystal from a boundary with the back surface and an inclined surface that is inclined from the rising surface toward a boundary with the front surface so that an interval between the two first side surfaces becomes closer, each of the two rising surfaces having a first modified region, in which the sapphire single crystal is modified, along the boundary between the back surface and the rising surface, and each of the two second side surfaces has a second modified region, in which the sapphire single crystal is modified, along a boundary between the back surface and the second side surface.

According to a seventeenth aspect of the present invention, in the semiconductor light-emitting chip of the sixteenth aspect, the first modified region exists at a position whose depth from the back surface of the sapphire substrate is a first depth, and the second modified region exists at a position whose depth from the back surface of the sapphire substrate is a second depth that is deeper than the first depth.

According to an eighteenth aspect of the present invention, in the semiconductor light-emitting chip of the sixteenth aspect, a length of each of the first side surfaces in a direction along the boundary between the back surface and the rising surface is longer than a length of each of the second side surfaces in a direction along the boundary between the back surface and the second side surface.

According to a nineteenth aspect of the present invention, in the semiconductor light-emitting chip of the sixteenth aspect, the two second side surfaces in the sapphire substrate are formed along an A-plane of the sapphire single crystal.

According to the present invention, in producing the light-emitting chip, it is possible to suppress cracking in the semiconductor light-emitting element in the case where a sapphire single crystal is used as a substrate and the expected dividing line is assumed in the direction along an M-plane of the sapphire single crystal.

BRIEF DESCRIPTION OF THE DRAWINGS

Exemplary embodiments of the present invention will be described in detail based on the following figures, wherein:

FIG. 3A is a top view of the semiconductor lamination substrate as viewed from a side on which a semiconductor layer is laminated, FIG. 3B is a backside view of the semiconductor lamination substrate as viewed from the backside of the substrate, and FIG. 3C is a cross-sectional view taken along line IIIC-IIIC of FIG. 3A;

FIG. 4A is a top view of the element-group formation substrate as viewed from the side facing the surface thereof on which plural semiconductor light-emitting elements are formed, FIG. 4B is a backside view of the element-group formation substrate as viewed from the backside of the substrate, and FIG. 4C is a cross-sectional view taken along line IVC-IVC of FIG. 4A;

FIG. 5A is a top view of the element-group formation substrate after the dividing grooves are formed as viewed from the side facing the surface thereof on which plural semiconductor light-emitting elements are formed, FIG. 5B is a backside view of the element-group formation substrate after the dividing grooves are formed as viewed from the backside of the substrate, and FIG. 5C is a cross-sectional view taken along line VC-VC of FIG. 5A;

FIG. 6A is a top view of the element-group formation substrate after the second modified regions are formed as viewed from the side facing the surface thereof on which plural semiconductor light-emitting elements are formed, FIG. 6B is a backside view of the element-group formation substrate after the second modified regions are formed as viewed from the backside of the substrate, and FIG. 6C is a cross-sectional view taken along line VIC-VIC of FIG. 6A;

FIG. 7A is a top view of the element-group formation substrate after the first modified regions are formed as viewed from the side facing the surface thereof on which plural semiconductor light-emitting elements are formed, FIG. 7B is a backside view of the element-group formation substrate after the first modified regions are formed as viewed from the backside of the substrate, and FIG. 7C is a cross-sectional view taken along line VIIC-VIIC of FIG. 7A;

FIGS. 8A to 8C are diagrams showing other configuration examples of the element-group formation substrate; and FIG. 9 is a table showing relationship among processing conditions of the element-group formation substrate, configurations of the light-emitting chips obtained by dividing the element-group formation substrate after processing, and results of division of the element-group formation substrate after processing in examples 1 to 5 and comparative examples 1 and 2.

DETAILED DESCRIPTION

Hereinbelow, an exemplary embodiment according to the present invention will be described in detail with reference to accompanying drawings.

Figure 1:
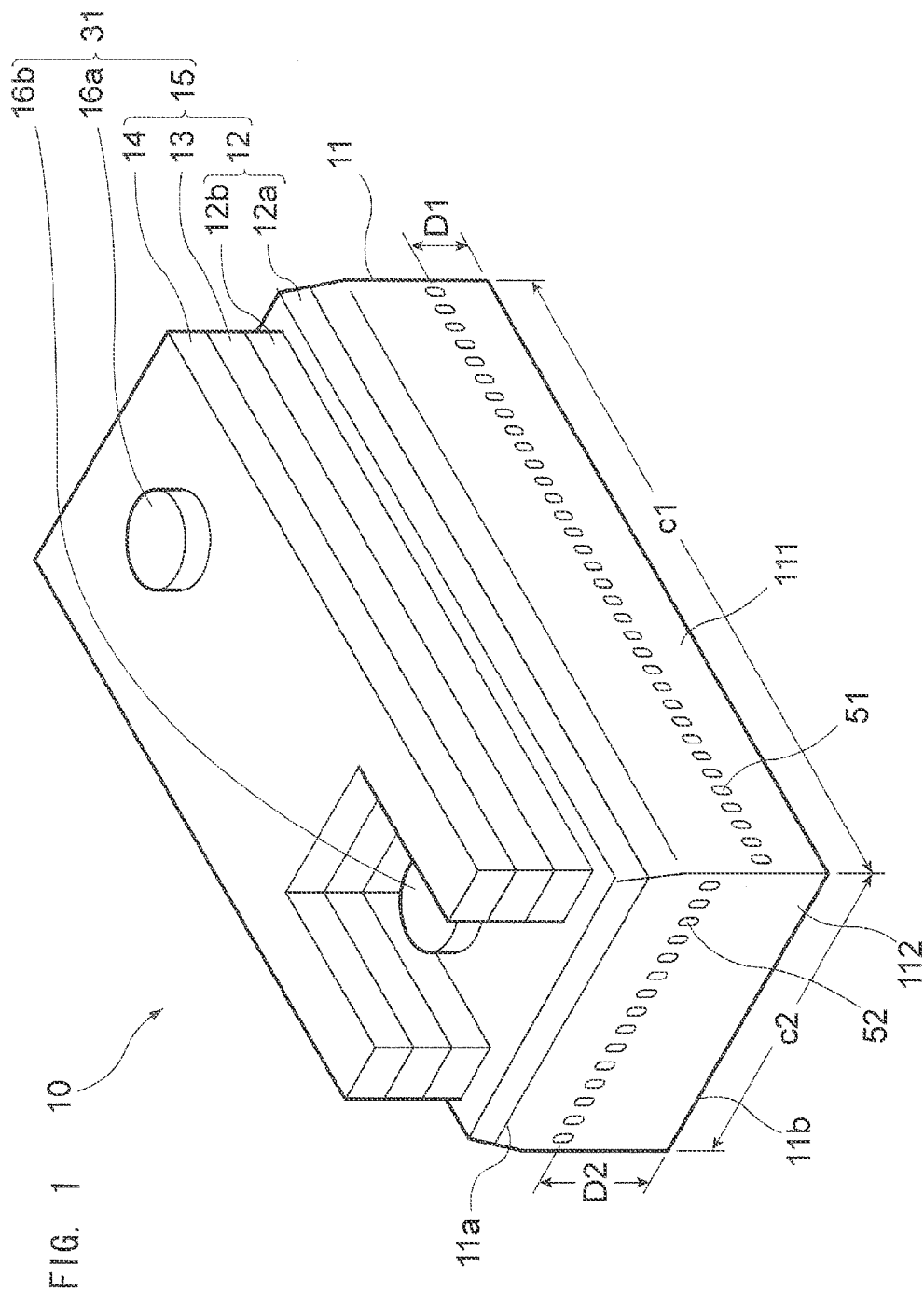
FIG. 1 is a perspective view showing an example of configuration of a light-emitting chip obtained by use of a production method of an exemplary embodiment.

FIG. 1 is a perspective view showing an example of configuration of a light-emitting chip 10 obtained by use of a production method of the exemplary embodiment.

The light-emitting chip 10 shown in FIG. 1 includes: a substrate 11 that has a substrate front surface 11a and a substrate back surface 11b which is on a backside of the substrate front surface 11a; a semiconductor layer 15 laminated on the substrate front surface 11a of the substrate 11; and a p-electrode 16a and an n-electrode 16b formed on the semiconductor layer 15. With the semiconductor layer 15, the p-electrode 16a and the n-electrode 16b, a semiconductor light-emitting element 31 is configured.

As the substrate 11, a sapphire single crystal in which a C-plane ([0001] plane) is assumed to be the substrate front surface 11a is used. It should be noted that the plane direction of the substrate 11 is provided with an off angle of 0° with respect to a crystal surface, or is inclined to each other at an off angle. If the substrate 11 is provided with an off angle, 1° or less is applied as the off angle. In the present invention, it is simply said that the substrate front surface 11a is a C-plane, including the case where the off angle is provided. Further, as the sapphire single crystal used as the substrate 11, those containing trace amounts of impurities may be employed.

Moreover, as the substrate 11 used in the present invention, for example, a processed substrate described in Japanese Patent Application Laid-Open Publication No. 2009-123717 (a substrate in which a top surface is constituted by a plane composed of a C-plane of a sapphire single crystal and plural convex portions that are not parallel to the plane) can also be preferably applied.

Further, as the semiconductor layer 15 laminated on the substrate 11, for example, a layer composed of a group III nitride semiconductor having a layer configuration described in Japanese Patent Application Laid-Open Publication No. 2009-123717 can be used. The semiconductor layer 15 includes: an n-type layer 12 laminated on the substrate front surface 11a of the substrate 11; a light-emitting layer 13 laminated on the n-type layer 12; and a p-type layer 14 laminated on the light-emitting layer 13. It should be noted that, for example, a buffer layer composed of the group III nitride semiconductor or a base layer (both not shown in the figure) may be formed between the substrate 11 and the n-type layer 12. Moreover, as described in Japanese Patent Application Laid-Open Publication No. 2009-123717, a transparent electrode layer (not shown in the figure) is formed on the p-type layer 14.

A p-electrode 16a and an n-electrode 16b are formed on the p-type layer 14 and the n-type layer 12, respectively. In the light-emitting chip 10, light is emitted from the light-emitting layer 13 by passing a current from the p-electrode 16a toward the n-electrode 16b through the p-type layer 14, the light-emitting layer 13 and the n-type layer 12.

As shown in FIG. 1, the light-emitting chip 10 of the present exemplary embodiment has a shape of substantially rectangular parallelepiped, and when the substrate front surface 11a is viewed from above, the substrate front surface 11a has a rectangular shape with long sides and short sides. Therefore, the substrate 11 has four substrate side surfaces in addition to the substrate front surface 11a and the substrate back surface 11b. Further, each of the substrate front surface 11a and the substrate back surface 11b has a rectangular shape with two long sides and two short sides.

In the present exemplary embodiment, of the four substrate side surfaces, two substrate side surfaces that share the long sides with the substrate front surface 11a and the substrate back surface 11b are provided along an M-plane ([11-20] plane) of the sapphire single crystal used as the substrate 11, and the other two substrate side surfaces that share the short sides with the substrate front surface 11a and the substrate back surface 11b are provided along an A-plane ([1-100] plane) of the sapphire single crystal. Here, "-" indicates a bar provided above the number that follows "-". In the description below, two substrate side surfaces along the M-plane of the sapphire single crystal are referred to as first substrate side surfaces 111, and two substrate side surfaces along the A-plane are referred to as second substrate side surfaces 112. Further, in the light-emitting chip 10, the length in the direction along the M-plane of the sapphire single crystal is referred to as first length c1, and the length in the direction along the A-plane is referred to as second length c2. In the present exemplary embodiment, the first length c1 and the second length c2 have a relation of c1>c2.

In the present exemplary embodiment, on each of the two first substrate side surfaces 111 provided to the substrate 11, there is a single line extending in the longitudinal direction of the first substrate side surface 111, and on each of the two second substrate side surfaces 112 provided to the substrate 11, there is also a single line extending in the longitudinal direction of the second substrate side surface 112. These lines are formed by modification of the sapphire single crystal constituting the substrate 11 by irradiation of laser light, which will be described later. It should be noted that, in the description below, the line existing on the first substrate side surface 111 is referred to as a first modified region 51, and the line existing on the second substrate side surface 112 is referred to as a second modified region 52.

Here, assuming that a distance from the substrate back surface 11b to the first modified region 51, which is in a direction perpendicular to the substrate back surface 11b, is a first depth D1 and that a distance from the substrate back surface 11b to the second modified region 52, which is in a direction perpendicular to the substrate back surface 11b, is a second depth D2, these depths have a relation of D1<D2.

Further, in each of the two first substrate side surfaces 111 facing each other, an area closer to the substrate front surface 11a than the other area where the first modified region 51 exists is inclined as approaching the substrate front surface 11a so that the distance between the two first substrate side surfaces 111 is reduced. This inclination is a trace of a dividing groove 41 (refer to FIGS. 5A and 5C described later) formed by laser ablation performed in a dividing groove forming process, which will be described later.

Accordingly, the first substrate side surface 111 as an example of a first side surface has an area as a rising surface that is provided closer to the substrate back surface 11b and has the first modified region 51, and the other area as an inclined surface that is provided closer to the substrate front surface 11a.

The n-type layer 12 in the present exemplary embodiment includes a lower stage 12a provided closer to the substrate front surface 11a and an upper stage 12b that is located above the lower stage 12a and has a projection area smaller than that of the lower stage 12a when the light-emitting chip 10 is viewed from above, on which the light-emitting layer 13 and the p-type layer 14 are laminated. Here, on the top surface of the lower stage 12a, a step is formed along the edge thereof between the lower stage 12a and the upper stage 12b. This step structure is a trace of a groove portion 32 (refer to FIGS. 4A to 4C described later) formed by etching or the like in an element-group forming process, which will be described later, and exists along the M-plane and the A-plane of the sapphire single crystal constituting the substrate 11.

Figure 2:
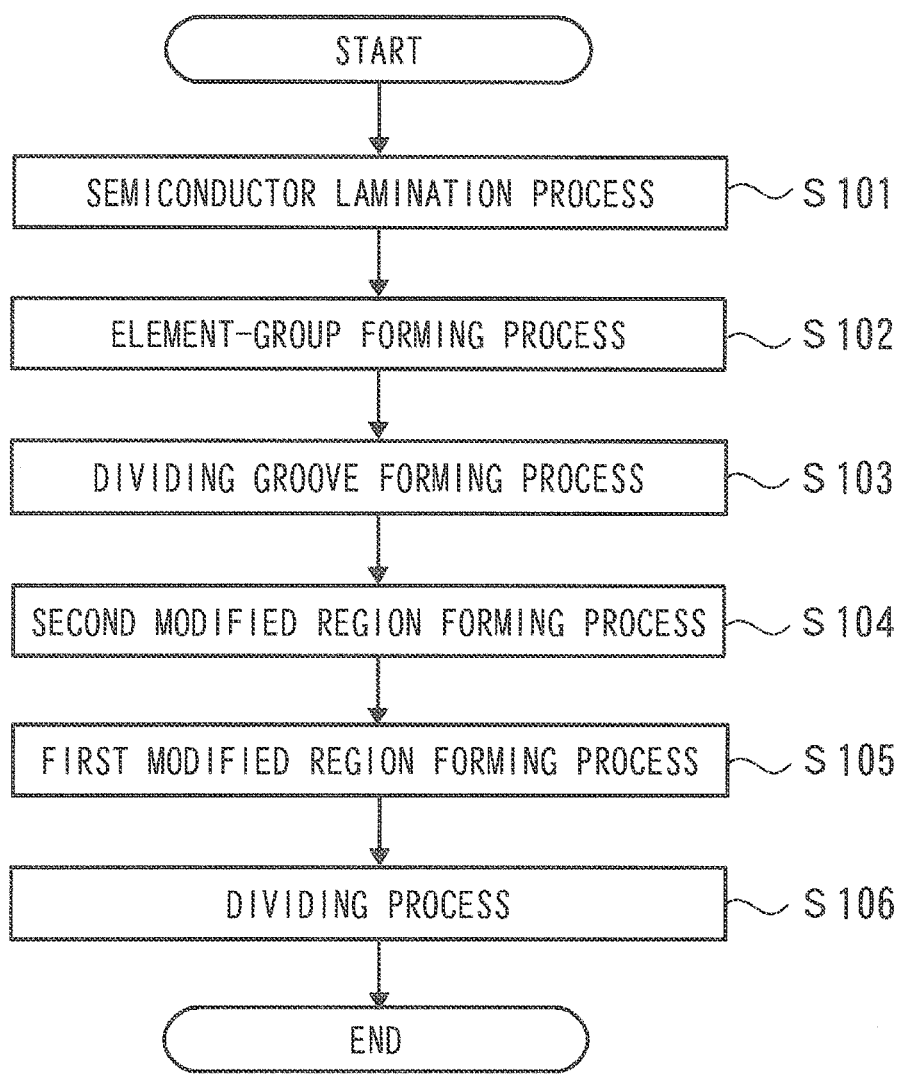
FIG. 2 is a flowchart showing an example of a method for producing the light-emitting chip.

FIG. 2 is a flowchart showing an example of a method for producing the light-emitting chip 10.

In this example, first of all, a semiconductor lamination process for obtaining a semiconductor lamination substrate 20 (refer to FIGS. 3A to 3C described later) by forming the semiconductor layer 15 on the wafer-shaped substrate 11 composed of the sapphire single crystal is performed (step 101).

Next, an element-group forming process for obtaining an element-group formation substrate 30 (refer to FIGS. 4A to 4C described later) by forming plural semiconductor light-emitting elements 31 in the semiconductor lamination substrate 20 obtained in step 101 is performed (step 102).

Subsequently, a dividing groove forming process is performed in which the above-described dividing grooves 41 are formed on the side of the substrate front surface 11a of the substrate 11 on the element-group formation substrate 30 obtained in step 102 (step 103).

Further subsequently, a second modified region forming process is performed in which the above-described second modified regions 52 are formed at the inside of the substrate 11 of the element-group formation substrate on which the dividing grooves 41 have been formed by step 103 (step 104).

Subsequently, a first modified region forming process is performed in which the above-described first modified regions 51 are formed at the inside of the substrate 11 of the element-group formation substrate 30 in which the second modified regions 52 have been formed by step 104 (step 105).

Then, a dividing process is performed in which individual pieces of the light-emitting chips 10 are obtained from the element-group formation substrate 30 by performing division starting on the first modified regions 51 and the second modified regions 52 on the element-group formation substrate 30 in which the dividing grooves 41 have been formed on the side of the substrate front surface 11a of the substrate 11 and the first modified regions 51 and the second modified regions 52 have been formed at the inside of the substrate 11 (step 106).

Subsequently, the process in each of the above-described steps will be described.

Figure 3A:
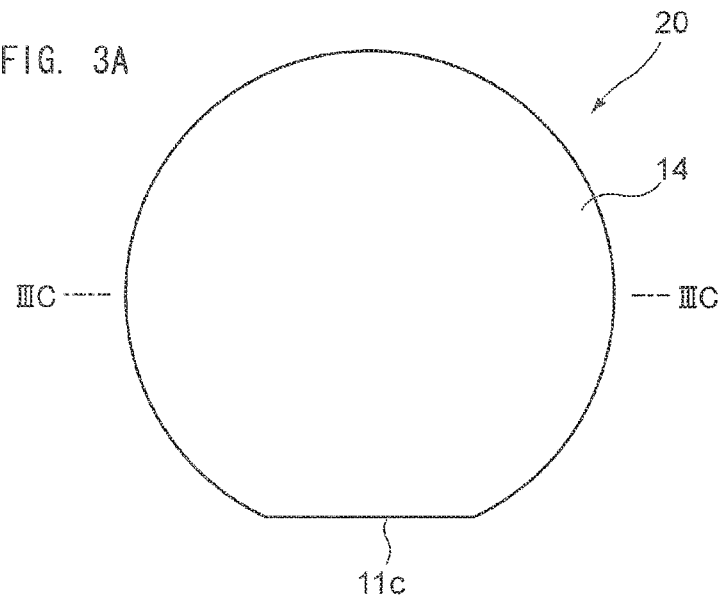
FIGS. 3A to 3C are diagrams showing an example of configuration of a semiconductor lamination substrate obtained by performing a semiconductor lamination process, where
Figure 3B:
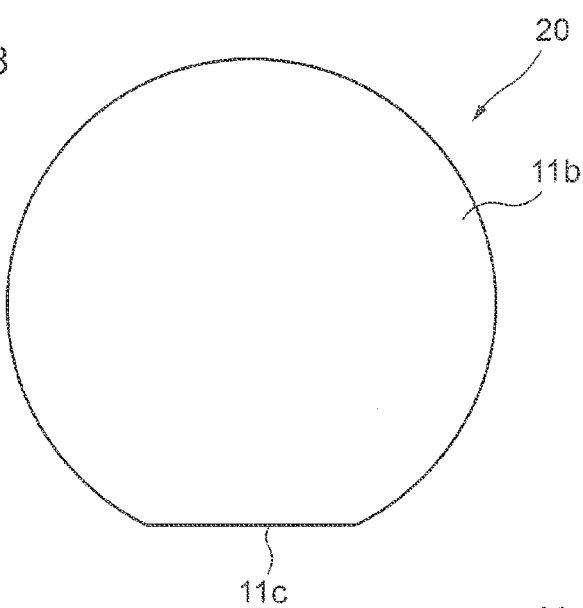
Figure 3C:
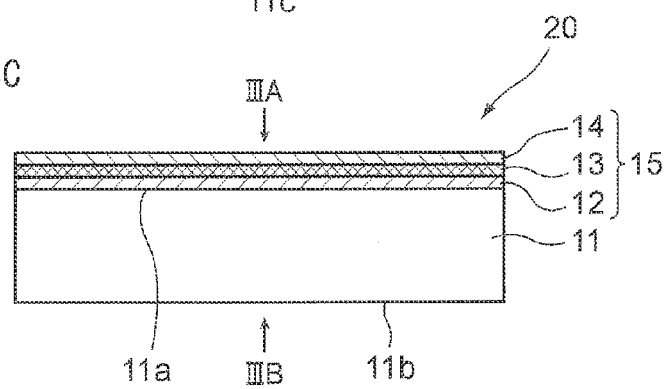

FIGS. 3A to 3C are diagrams showing an example of configuration of the semiconductor lamination substrate 20 obtained by performing the semiconductor lamination process in step 101. Here, FIG. 3A is a top view of the semiconductor lamination substrate 20 as viewed from a side on which the semiconductor layer 15 is laminated, FIG. 3B is a backside view of the semiconductor lamination substrate 20 as viewed from a side on which the semiconductor layer 15 is not laminated, and FIG. 3C is a cross-sectional view taken along line IIIC-IIIC of FIG. 3A. It should be noted that FIG. 3A corresponds to FIG. 3C as viewed from the IIIA direction, and FIG. 3B corresponds to FIG. 3C as viewed from the IIIB direction.

The semiconductor lamination substrate 20 includes the substrate 11 in a wafer shape and the semiconductor layer 15 laminated on almost all the surface of the substrate front surface 11a of the substrate 11.

As shown in FIG. 3A, on the side where the semiconductor layer 15 is laminated, the p-type layer 14 of the laminated semiconductor layer 15 is exposed. On the other hand, as shown in FIG. 3B, on the side where the semiconductor layer 15 is not laminated, the substrate back surface 11b of the substrate 11 is exposed.

In the exemplary embodiment, as the substrate 11, a sapphire single crystal whose C-plane is a principal plane (substrate front surface 11a) can be used. At one end of the wafer-shaped substrate 11, an orientation flat (OF) 11c that indicates crystal orientation of the substrate 11 is provided. In the exemplary embodiment, the OF 11c is formed along the A-plane ([1-100] plane) of the sapphire single crystal.

When the semiconductor layer 15 is formed on the substrate 11, it is preferable to use the substrate 11 having a thickness of 300 μm to 1000 μm. If the thickness of the substrate 11 is less than 300 μm, the substrate 11 is warped in the process of laminating the semiconductor layer 15, which causes inconvenience. Further, if the thickness of the substrate 11 exceeds 1000 μm, much effort is required to make the substrate 11 thin by abrasion after laminating the semiconductor layer 15.

To form the semiconductor layer 15 on the substrate front surface 11a of the substrate 11, first, the n-type layer 12 is laminated on the substrate front surface 11a of the substrate 11, subsequently, the light-emitting layer 13 is laminated on the n-type layer 12 laminated on the substrate front surface 11a, and thereafter, the p-type layer 14 is laminated on the light-emitting layer 13 laminated on the n-type layer 12.

As a method of laminating the semiconductor layer 15 on the substrate front surface 11a of the substrate 11, a metalorganic chemical vapor deposition method (MOCVD method), a hydride vapor phase epitaxy method (HVPE method), a molecular beam epitaxy method (MBE method), a sputtering method or the like can be employed. As an especially preferred lamination method, the MOCVD method is provided in terms of layer thickness controlling properties and volume productivity.

In the MOCVD method, for example, in the case of the group III nitride semiconductor, hydrogen ($H_2$) or nitrogen ($N_2$) is used as a carrier gas, trimethylgallium (TMG) or triethylgallium (TEG) is used as a source of Ga which is a group III raw material, trimethylaluminum (TMA) or triethylaluminum (TEA) is used as a source of Al, trimethylindium (TMI) or triethylindium (TEI) is used as a source of In, ammonia ($NH_3$), hydrazine ($N_2H_4$) or the like is used as a source of N which is a group V raw material. Further, as a dopant, for the n-type, monosilane ($SiH_4$) or disilane ($Si_2H_6$) is used as a raw material of Si, and organic germanium compounds are used as a Ge raw material, and for the p-type, for example, Bis(cyclopentadienyl)magnesium ($Cp_2Mg$) or Bis(ethylcyclopentadienyl)magnesium (($EtCp)_2Mg$) is used as an Mg raw material.

Subsequently, the element-group forming process in step 102 will be described.

Figure 4A:
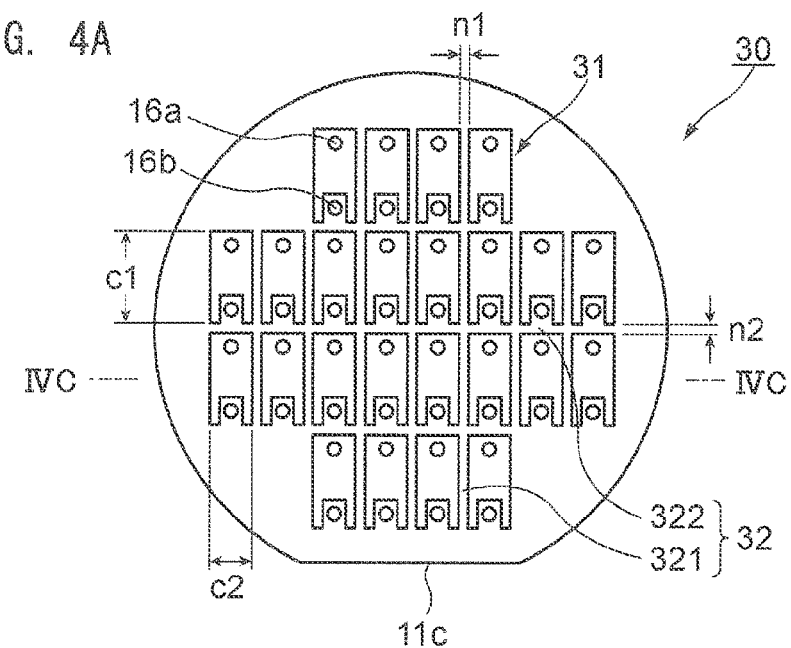
FIGS. 4A to 4C are diagrams showing an example of configuration of an element-group formation substrate obtained by performing an element-group forming process, where
Figure 4B:
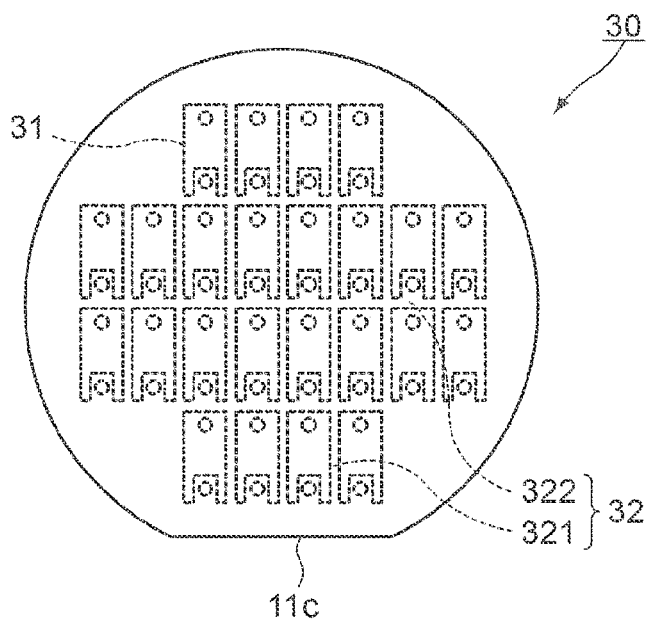
Figure 4C:
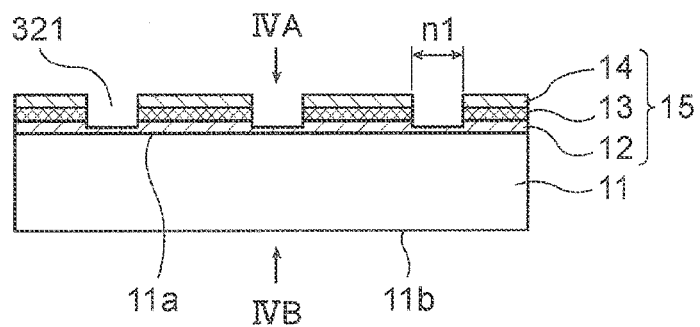

FIGS. 4A to 4C are diagrams showing an example of configuration of the element-group formation substrate 30 obtained by performing the element-group forming process in step 102 on the semiconductor lamination substrate 20 shown in FIGS. 3A to 3C. Here, FIG. 4A is a top view of the element-group formation substrate 30 as viewed from the side facing the surface thereof on which plural semiconductor light-emitting elements 31 are formed, FIG. 4B is a backside view of the element-group formation substrate 30 as viewed from the side of the substrate back surface 11b of the substrate 11, and FIG. 4C is a cross-sectional view taken along line IVC-IVC of FIG. 4A. It should be noted that FIG. 4A corresponds to FIG. 4C as viewed from the IVA direction, and FIG. 4B corresponds to FIG. 4C as viewed from the IVB direction.

As shown in FIGS. 4A and 4C, the groove portions 32 are formed along the M-plane and the A-plane of the sapphire single crystal constituting the substrate 11 so as to divide the laminated semiconductor layer 15 into the plural semiconductor light-emitting elements 31. In the description below, the groove portions 32 formed along the M-plane of the sapphire single crystal will be referred to as first groove portions 321, and the groove portions 32 formed along the A-plane of the sapphire single crystal will be referred to as second groove portions 322. Here, on the element-group formation substrate 30, the plural first groove portions 321 are formed substantially in parallel so that an interval between adjacent first groove portions 321 becomes equal. In similar way, on the element-group formation substrate 30, the plural second groove portions 322 are formed substantially in parallel so that an interval between adjacent second groove portions 322 becomes equal. Further, in the present exemplary embodiment, the interval between the adjacent first groove portions 321 is set smaller than the interval between the adjacent second groove portions 322.

It should be noted that, in the exemplary embodiment, the direction along the M-plane of the sapphire single crystal constituting the substrate 11 and the substrate front surface 11a corresponds to "first direction", and the direction along the A-plane of the sapphire single crystal and the substrate front surface 11a corresponds to "second direction".

In the element-group forming process in step 102, first, part of the n-type layer 12 is exposed by removing a part of the semiconductor layer 15 from the semiconductor lamination substrate 20 formed in the semiconductor lamination process in step 101 to form a region for providing the n-electrode 16b, the first groove portions 321 and the second groove portions 322.

Removal of a part of the semiconductor layer 15 from the semiconductor lamination substrate 20 is performed by etching of the semiconductor layer 15 using a known photolithographic technology or etching technology.

As a method for forming the first groove portions 321 and the second groove portions 322, it is preferable to use an etching method such as wet etching and dry etching. This is because, compared to other methods, the etching method causes less damage to other part of the semiconductor layer 15 that is not to be removed.

Of the etching methods, as the dry etching, for example, methods such as reactive ion etching, ion milling, focused beam etching and ECR etching can be used, and in the wet etching, for example, mixed acid of sulfuric acid and phosphoric acid can be used. Prior to performing etching, a predetermined mask is formed on the surface of the laminated semiconductor layer 15 so as to obtain a desired chip shape.

It should be noted that, as a method of forming the first groove portions 321 and the second groove portions 322, other than the aforementioned etching methods, any known method such as a dicing method and a method employing laser irradiation can be used without any limitation.

Further, in the exemplary embodiment, part of the n-type layer 12 is exposed to provide the n-electrode 16b at the same time with the formation of the first groove portions 321 and the second groove portions 322, however, these may be achieved in separate processes.

The width n1 of the first groove portions 321 and the width n2 of the second groove portions 322 are preferably in the range of 10 μm to 30 μm, and more preferably in the range of 15 μm to 25 μm. If the widths n1 and n2 are less than 10 μm, compared to the case where the widths n1 and n2 are set to 10 μm or more, the possibility that a cutting surface reaches the semiconductor light-emitting elements 31 in the dividing process in step 106 is increased, and thereby cracking in the semiconductor light-emitting elements 31 is apt to occur in the obtained light-emitting chip 10. On the other hand, if the widths n1 and n2 are more than 30 μm, compared to the case where the widths n1 and n2 are set to 30 μm or less, the number of chips available from the single wafer is decreased, and thereby it is not preferable in terms of productivity. It should be noted that the widths n1 and n2 may be the same width or different widths as long as they are within the above range. However, it is more preferable to set the width n1 smaller than the width n2 (n1<n2).

The depth of the first groove portions 321 and the second groove portions 322 from the surface of the semiconductor layer 15 (top surface of the p-type layer 14) is not particularly limited and may be any depth. Though the depth differs depending on the thickness of the semiconductor layer 15, generally, the distance between the surface of the semiconductor layer 15 and the bottom portions of the first groove portions 321 and the second groove portions 322 is the order of 1 μm to 10 μm. It should be noted that, in the region where the first groove portions 321 and the second groove portions 322 are formed, it is also possible to expose the substrate front surface 11a of the substrate 11 by removing the entire semiconductor layer 15.

Further, the cross-section of the first groove portion 321 and the second groove portion 322 may have any shape such as a rectangle, a U-shape and a V-shape, but a rectangle is preferred.

Moreover, in the present exemplary embodiment, the first groove portions 321 and the second groove portions 322 are formed so that, as the light-emitting chip 10 is viewed from above the substrate front surface 11a, the light-emitting chip 10 has a rectangular shape in which the direction along the M-plane of the sapphire single crystal constituting the substrate 11 is assumed to be a long side, and the direction along the A-plane is assumed to be a short side (c1>c2). However, the shape is not limited thereto, and the shape of the light-emitting chip 10 as viewed from above the substrate front surface 11a may be a square (c1=c2) or a rectangle in which the direction along the A-plane of the sapphire single crystal is assumed to be a long side, and the direction along the M-plane is assumed to be a short side (c1<c2). In the present invention, a rectangle in which the direction along the M-plane of the sapphire single crystal constituting the substrate 11 is assumed to be a long side, or, a square is particularly preferred.

In the element-group forming process in step 102, subsequently, the p-electrode 16a is formed at a predetermined position on the semiconductor layer 15, namely, the p-type layer 14, and the n-electrode 16b is formed on the n-type layer 12 that has been exposed.

As the p-electrode 16a and the n-electrode 16b, various types of compositions and structures are known, and these known compositions and structures can be used without any limitation. Further, as the methods for forming the p-electrode 16a and the n-electrode 16b, known methods such as a vacuum deposition method and a sputtering method can be employed without any limitation.

In the element-group forming process in step 102, next, the substrate back surface 11b of the substrate 11 is ground and polished so that the substrate 11 has a predetermined thickness.

The thickness of the substrate 11 after processing is 60 μm to 300 μm, preferably 80 μm to 250 μm, and more preferably 100 μm to 200 μm. By providing the thickness of the substrate 11 within the above range, division of the element-group formation substrate 30 in the dividing process in step 106 becomes easier, and the element-group formation substrate 30 can be efficiently divided.

Subsequently, the dividing groove forming process in step 103 will be described.

Figure 5A:
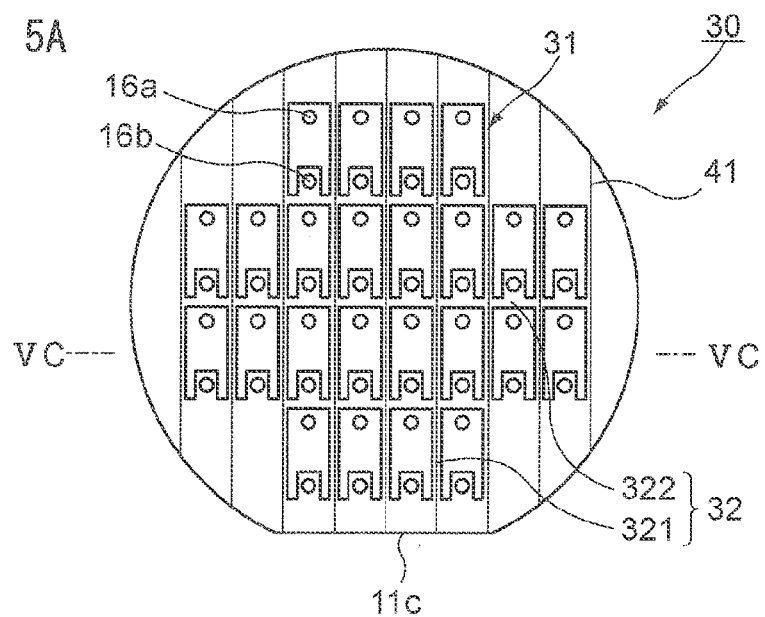
FIGS. 5A to 5C are diagrams showing an example of configuration of the element-group formation substrate after dividing grooves are formed, which is obtained by performing a dividing groove forming process, where
Figure 5B:
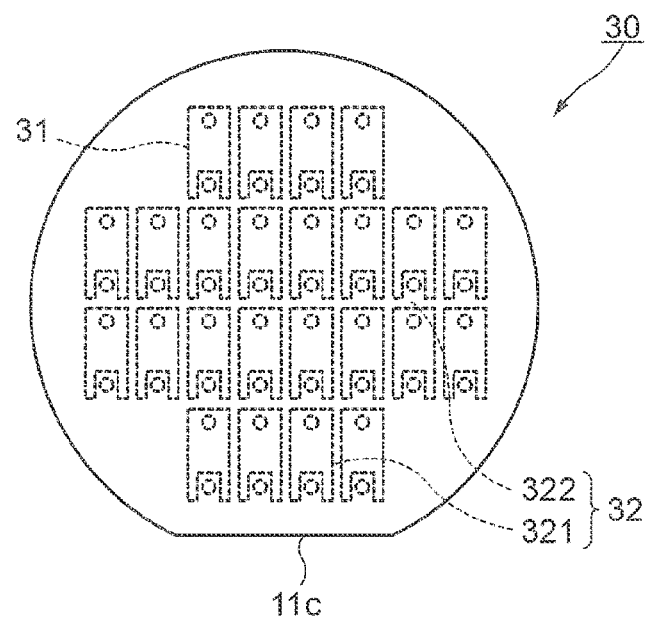
Figure 5C:
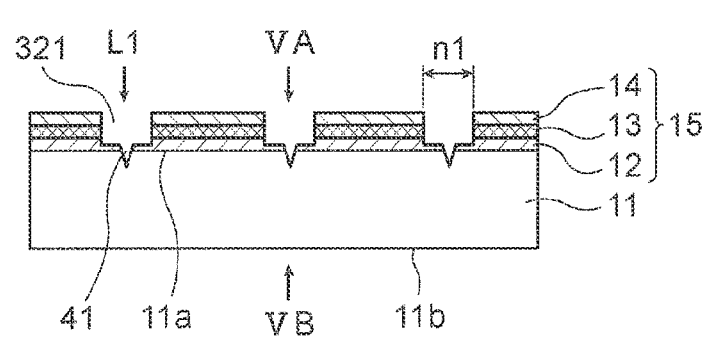

FIGS. 5A to 5C are diagrams showing an example of configuration of the element-group formation substrate 30 after the dividing grooves 41 are formed, which is obtained by performing the dividing groove forming process in step 103 on the element-group formation substrate 30 shown in FIGS. 4A to 4C. Here, FIG. 5A is a top view of the element-group formation substrate 30 after the dividing grooves 41 are formed as viewed from the side facing the surface thereof on which plural semiconductor light-emitting elements 31 are formed, FIG. 5B is a backside view of the element-group formation substrate 30 after the dividing grooves 41 are formed as viewed from the side of the substrate back surface 11b of the substrate 11, and FIG. 5C is a cross-sectional view taken along line VC-VC of FIG. 5A. It should be noted that FIG. 5A corresponds to FIG. 5C as viewed from the VA direction, and FIG. 5B corresponds to FIG. 5C as viewed from the VB direction.

As shown in FIGS. 5A and 5C, the dividing groove 41 is formed on the bottom portion of each of the plural first groove portions 321 formed along the M-plane of the sapphire single crystal constituting the substrate 11 in step 102. Accordingly, there are plural dividing grooves 41 formed on the element-group formation substrate 30.

It should be noted that, in the present invention, the dividing grooves 41 are formed on the bottom portions of the plural first groove portions 321, but need not be formed on the bottom portions of the second groove portions 322.

Further, the plural dividing grooves 41 are formed substantially in parallel to make intervals between adjacent dividing grooves 41 substantially equal to each other.

The dividing groove 41 is formed so that the tip end thereof reaches the inside of the substrate 11, but does not reach the substrate back surface 11b. The depth of the dividing groove 41 from the bottom portion of the first groove portion 321 to the tip end of the dividing groove 41 in the direction perpendicular to the substrate front surface 11a is preferably 10 μm or more from the substrate front surface on which the semiconductor is formed, and the range of 10 μm to 30 μm is particularly preferred. If the depth is less than 10 μm, the cut surface becomes oblique in the dividing process in step 106 and cracking occurs in the semiconductor light-emitting elements 31 in the light-emitting chip 10, which results in many defective cases.

Moreover, the width of the dividing groove 41 is provided in a range that is smaller than the width n1 of the first groove portion 321.

The cross-section of the dividing groove 41 may have any shape such as a rectangle, a U-shape and a V-shape, but a V-shape is preferred. This is because, in the case of employing the V-shaped cross-section, when the element-group formation substrate 30 is divided into the light-emitting chips 10 in the dividing process in step 106, cracking occurs from around the tip end of the V-shaped dividing groove 41, and thereby it is possible to cut the element-group formation substrate 30 substantially perpendicular to the substrate front surface 11a.

In the present exemplary embodiment, the dividing grooves 41 are formed by a method using laser irradiation.

Specifically, irradiation of laser light L1 is performed on the element-group formation substrate 30 from the side on which the plural semiconductor light-emitting elements 31 are formed, the irradiation being performed along each of the plural first groove portions 321 in order to form the plural dividing grooves 41 by laser ablation.

Examples of the laser that can be used to form the dividing grooves 41 include a $CO_2$ laser, a YAG laser and an excimer laser. In the present exemplary embodiment, of these lasers, the use of a pulse-irradiation type laser is preferred rather than the use of a continuous-irradiation type laser.

The laser with the wavelength of, for example, 355 nm or 266 nm can be used, and further the wavelength longer than the aforementioned one such as 532 nm and 1064 nm, or the shorter wavelength may also be used.

The frequency of the laser is preferably 1 Hz to 100000 Hz, and more preferably, 30000 Hz to 70000 Hz.

The output of the laser differs depending on the width or the depth of the dividing groove 41 to be formed, but a minimum output necessary to obtain desired dividing grooves 41 is preferred. This is because an excessive laser output causes heat damage to the substrate 11 or the semiconductor layer 15. The laser output is, for example, in general, preferably 2 W or less, and more preferably 1 W or less.

Further, in the case where the dividing grooves 41 are formed by the laser method, there is a possibility that soil flying as laser irradiation is performed is adhered to the surface of the laminated semiconductor layer 15, and thereby the electrical properties of the light-emitting chip 10 are deteriorated. To prevent this, a protecting film is formed on the surface of the semiconductor layer 15 using a resist with excellent heat resistance or the like, and after the dividing grooves 41 are formed, the protecting film may be removed together with the soil adhered to the protecting film.

It should be noted that the method of forming the dividing grooves 41 is not limited to the above-described method using laser irradiation, and it is possible to employ known methods such as a dicing method, an etching method and a scribing method. However, as the method of forming the dividing grooves 41, the method using laser irradiation is preferred. This is because the method using laser irradiation can form the dividing grooves 41 with desired depths, and can form the dividing grooves 41 promptly compared to the etching method. Further, this is also because, in the method using laser irradiation, unevenness of processing accuracy is less than those in the dicing method or the scribing method due to consumption and deterioration of a blade or diamond needle, and costs for replacing those edges or the like can be reduced.

Subsequently, the second modified region forming process in step 104 will be described.

Figure 6A:
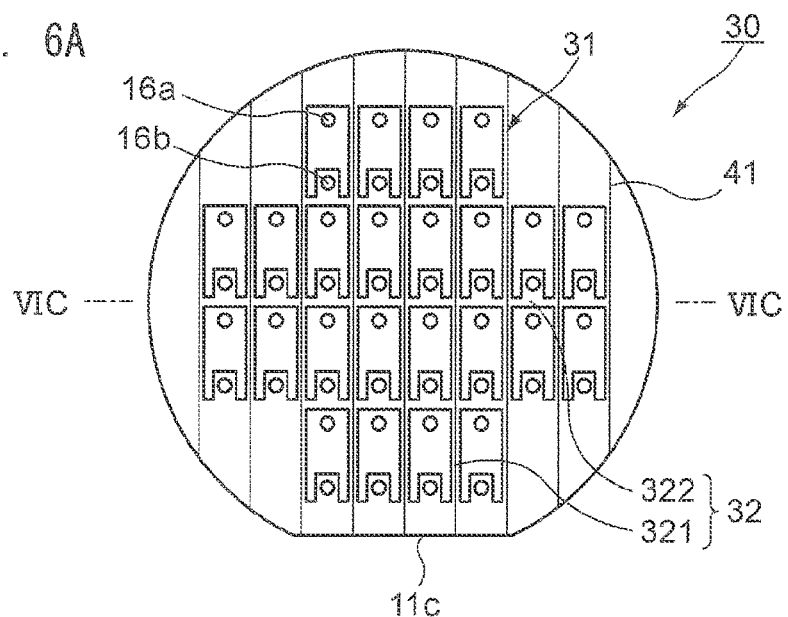
FIGS. 6A to 6C are diagrams showing an example of configuration of the element-group formation substrate after second modified regions are formed, which is obtained by performing a second modified region forming process, where
Figure 6B:
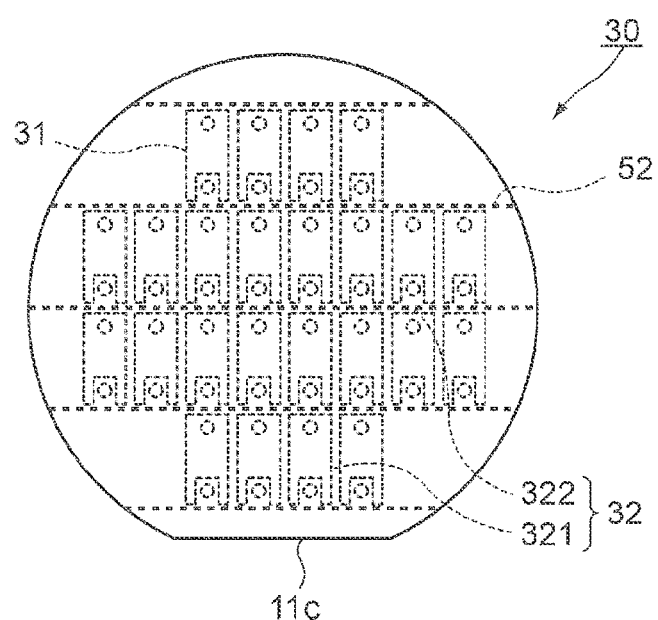
Figure 6C:
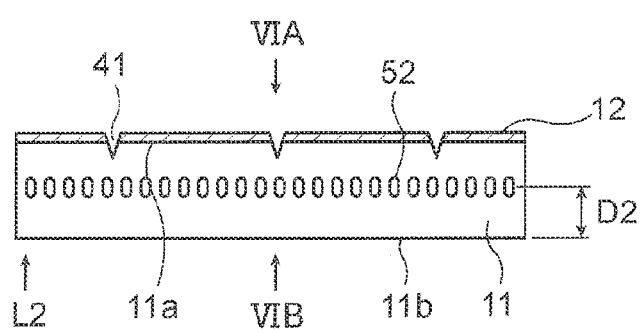

FIGS. 6A to 6C are diagrams showing an example of configuration of the element-group formation substrate 30 after the second modified regions 52 are formed, which is obtained by performing the second modified region forming process in step 104 on the element-group formation substrate 30 after the dividing grooves 41 are formed shown in FIGS. 5A to 5C. Here, FIG. 6A is a top view of the element-group formation substrate 30 after the second modified regions 52 are formed as viewed from the side facing the surface thereof on which plural semiconductor light-emitting elements 31 are formed, FIG. 6B is a backside view of the element-group formation substrate 30 after the second modified regions 52 are formed as viewed from the side of the substrate back surface 11b of the substrate 11, and FIG. 6C is a cross-sectional view taken along line VIC-VIC of FIG. 6A. It should be noted that FIG. 6A corresponds to FIG. 6C as viewed from the VIA direction, and FIG. 6B corresponds to FIG. 6C as viewed from the VIB direction.

As shown in FIGS. 6B and 6C, the second modified regions 52 are formed at the inside of the substrate 11 along the second groove portions 322. Further, as shown in FIGS. 6A to 6C, the second modified region 52 and the second groove portion 322 are formed to overlap each other as viewed from the direction perpendicular to the substrate front surface 11a.

Moreover, as shown in FIG. 6C, the second modified region 52 is formed so that the distance between the second modified region 52 and the substrate back surface 11b (second depth D2) becomes shorter than the distance between the tip end of the dividing groove 41 and the substrate back surface 11b.

The second modified regions 52 are formed at the inside of the substrate 11 by irradiation of laser light L2 along the plural second groove portions 322 in order from the side of the substrate back surface 11b of the substrate 11.

To be described specifically, irradiation of the laser light L2, which is pulse-oscillated, is performed along the second groove portions 322. At this time, irradiation is performed so that the laser light L2 is focused on a position where the distance from the substrate back surface 11b is equal to the second depth D2.

At the inside of the substrate 11, a modified portion that has been modified is formed by melting and re-solidifying the sapphire single crystal constituting the substrate 11 or causing multimolecular adsorption at a focal spot of the laser light L2.

In the present exemplary embodiment, the position of irradiation of the laser light L2 at the inside of the substrate 11 is set to be moved in succession along the second groove portions 322 every time the laser light L2 for a single pulse is emitted. Consequently, at the inside of the substrate 11, plural modified portions are successively formed along the second groove portions 322 at the positions corresponding to the second depths D2 from the substrate back surface 11b. The second modified region 52 is configured with the plural modified portions formed along the second groove portions 322.

As the laser that can be used to form the second modified region 52, a YAG laser, which performs pulse irradiation, or the like is provided. As the wavelength of the laser light L2, for example, 1064 nm, 532 nm, 355 nm or 266 nm can be employed, and the frequency of the laser light L2 is, for example, set to 15000 Hz to 300000 Hz. Further, intensity of the laser light L2 is within the range of 1.5 µJ to 5.0 µJ.

Subsequently, the first modified region forming process in step 105 will be described.

Figure 7A:
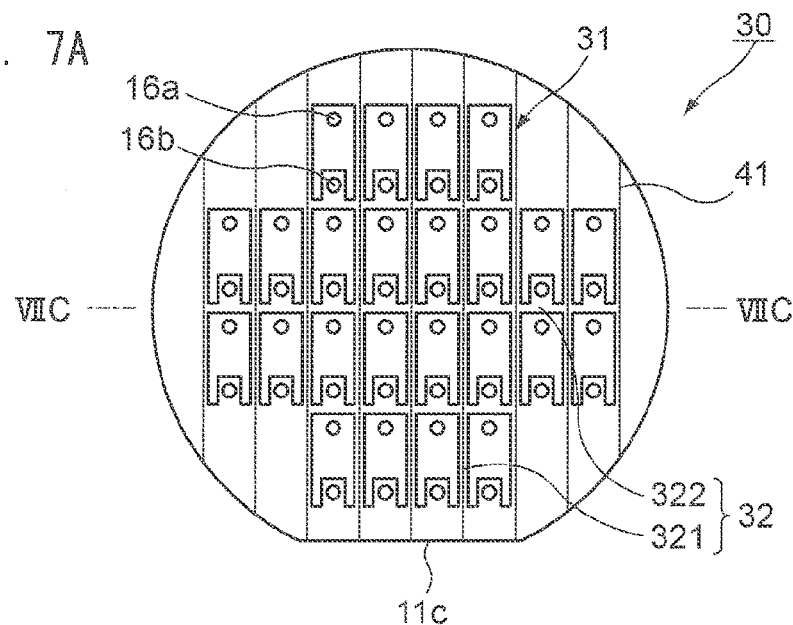
FIGS. 7A to 7C are diagrams showing an example of configuration of the element-group formation substrate after first modified regions are formed, which is obtained by performing a first modified region forming process, where
Figure 7B:
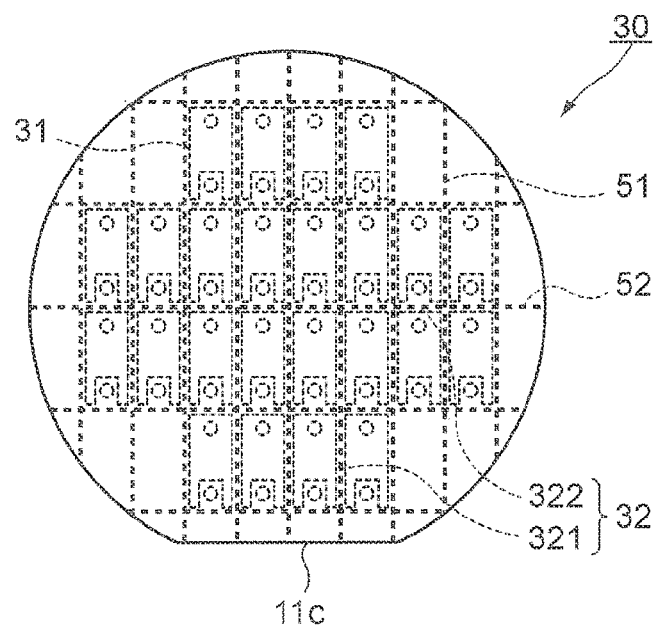
Figure 7C:
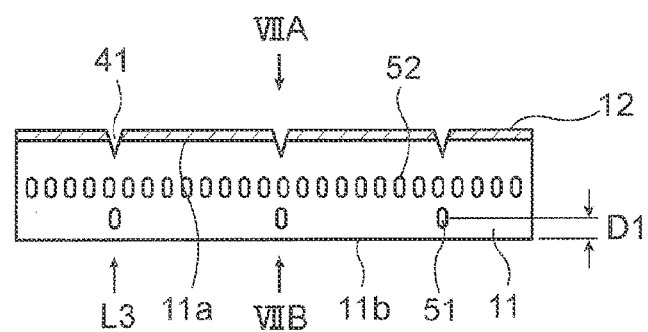

FIGS. 7A to 7C are diagrams showing an example of configuration of the element-group formation substrate 30 after the first modified regions 51 are formed, which is obtained by performing the first modified region forming process in step 105 on the element-group formation substrate 30 after the second modified regions 52 are formed shown in FIGS. 6A to 6C. Here, FIG. 7A is a top view of the element-group formation substrate 30 after the first modified regions 51 are formed as viewed from the side facing the surface thereof on which plural semiconductor light-emitting elements 31 are formed, FIG. 7B is a backside view of the element-group formation substrate 30 after the first modified regions 51 are formed as viewed from the side of the substrate back surface 11b of the substrate 11, and FIG. 7C is a cross-sectional view taken along line VIIC-VIIC of FIG. 7A. It should be noted that FIG. 7A corresponds to FIG. 7C as viewed from the VIIA direction, and FIG. 7B corresponds to FIG. 7C as viewed from the VIIB direction.

As shown in FIGS. 7B and 7C, the first modified regions 51 are formed inside of the substrate 11 along the first groove portions 321. Further, as shown in FIGS. 7A to 7C, the first modified region 51 and the first groove portion 321 are formed to overlap each other as viewed from the direction perpendicular to the substrate front surface 11a. Moreover, as shown in FIGS. 7A to 7C, the first modified region 51 and the dividing groove 41 formed on the first groove portion 321 are formed to overlap each other as viewed from the direction perpendicular to the substrate front surface 11a.

Then, as shown in FIG. 7C, the first modified region 51 is formed so that the distance between the first modified region 51 and the substrate back surface 11b (first depth D1) becomes shorter than the distance between the tip end of the dividing groove 41 and the substrate back surface 11b, and that the first depth D1 becomes shorter than the distance between the second modified region 52 and the substrate back surface 11b (D1<D2).

The first modified regions 51 are formed at the inside of the substrate 11 by irradiation of laser light L3 along the plural first groove portions 321 and the dividing grooves 41 in order from the side of the substrate back surface 11b of the substrate 11.

To be described specifically, irradiation of the laser light L3, which is pulse-oscillated, is performed along the first groove portions 321 and the dividing grooves 41. At this time, irradiation is performed so that the laser light L3 is focused on a position where the distance from the substrate back surface 11b is equal to the first depth D1.

At the inside of the substrate 11, a modified portion that has been modified is formed by melting and re-solidifying the sapphire single crystal constituting the substrate 11 or causing multimolecular adsorption at a focal spot of the laser light L3.

In the present exemplary embodiment, the position of irradiation of the laser light L3 at the inside of the substrate 11 is set to be moved in succession along the first groove portions 321 and the dividing grooves 41 every time the laser light L3 for a single pulse is emitted. Consequently, at the inside of the substrate 11, plural modified portions are successively formed along the first groove portions 321 and the dividing grooves 41 at the positions corresponding to the first depths D1 from the substrate back surface 11b. The first modified region 51 is configured with the plural modified portions formed along the first groove portions 321 and the dividing grooves 41.

As the laser that can be used to form the first modified region 51, the YAG laser, which performs pulse irradiation, is provided. It should be noted that the same laser as that used to form the second modified region 52 may be used, or different one maybe used.

The laser light L3 of the wavelength of, for example, 1064 nm, 532 nm, 355 nm or 266 nm can be employed, and the frequency of the laser light L3 is, for example, set to 15000 Hz to 300000 Hz.

The intensity of the laser light L3 can be set, for example, within the range of 1.5 µJ to 5.0 µJ.

It should be noted that it is preferable to set the intensity of the laser light L3 for forming the first modified regions 51 lower than the intensity of the laser light L2 for forming the second modified regions 52. This is due to the following reasons. The sapphire single crystal has a property that cracks apt to occur along the M-plane rather than the A-plane. Further, in the exemplary embodiment, while only the second modified regions 52 are formed along the A-plane of the sapphire single crystal constituting the substrate 11, the first modified regions 51 and the dividing grooves 41 are formed along the M-plane of the sapphire single crystal. Here, in the case where the intensity of the laser light L3 is lower than that of the laser light L2, each of the modified portions constituting the first modified region 51 may be of low degree modification compared to each of the modified portions constituting the second modified region 52. However, even if such a configuration is employed, in the dividing process in step 106, with respect to the direction along the M-plane of the sapphire single crystal of the element-group formation substrate 30, division can be performed while suppressing inclination with respect to the M-plane of the sapphire single crystal using the first modified regions 51, which are modified with a degree lower than that of the second modified regions 52, and the dividing grooves 41. Further, of the element-group formation substrate 30, with respect to the direction along the A-plane of the sapphire single crystal, division can be performed using the second modified regions 52 singly, which is modified with a degree higher than that of the first modified regions 51.

Moreover, in the present exemplary embodiment, in the case where the intensity of the laser light L3 is set lower than the intensity of the laser light L2, it is possible to make intervals between the plural modified portions constituting the first modified region 51 shorter than intervals between the plural modified portions constituting the second modified region 52. As described above, in the case where the intensity of the laser light L3 is lower than that of the laser light L2, each of the modified portions constituting the first modified region 51 may be of low degree modification compared to each of the modified portions constituting the second modified region 52. However, in the case where the intervals between the adjacent modified portions in the first modified region 51 are set shorter than the intervals between the adjacent modified portions in the second modified region 52, a density of the modified portions constituting the first modified region 51 becomes higher than that of the modified portions constituting the second modified region 52. This makes it possible to offset a difference in strength due to discrepancy between the modification degrees of respective modification portions with a difference in density between the respective modification portions, and it is thus possible to reduce a difference in the strength between the first modified region 51 and the second modified region 52. Consequently, in the division performed in the direction along the M-plane of the sapphire single crystal of the element-group formation substrate 30 in the dividing process in step 106, cracking starting on the first modified region 51 is apt to occur. As a result, it is possible to further suppress inclination of the cut surface that can be obtained (first substrate side surfaces 111) with respect to the M-plane of the sapphire single crystal.

Further, in the present exemplary embodiment, after the second modified regions 52 are formed at the second depth D2 at the inside of the substrate 11, the first modified regions 51 are formed at the first depth D1, which is a distance from the substrate back surface 11b shorter than that of the second depth D2. This is due to the following reason. In the case where the magnitude relation between the first depth D1 and the second depth D2 is reversed (D1>D2), in the first modified region forming process in step 105, the laser light L3 is focused on the first depth D1 through the second modified regions 52 formed at the second depth D2. Then, since the laser light L3 is affected by scattering or the like by the second modified regions 52, the focusing efficiency of the laser light L3 at the first depth D1 is deteriorated, and thereby the first modified regions 51 tend to be hardly formed.

It should be noted that, in the present exemplary embodiment, "modified region forming process" is constituted by the second modified region forming process in step 104 and the first modified region forming process in step 105.

Next, the dividing process in step 106 will be described.

In the dividing process, after the first modified region forming process in step 105 is completed, the element-group formation substrate 30, in which up to the first modified regions 51 shown in FIGS. 7A to 7C are formed, is cut along the dividing grooves 41, the first modified regions 51 and the second modified regions 52 to be divided into the plural light-emitting chips 10.

Specifically, by pressing a blade (not shown) against the element-group formation substrate 30 shown in FIGS. 7A to 7C along the dividing grooves 41, the first modified regions 51 and the second modified regions 52, cracks starting on the first modified regions 51 and the second modified regions 52 are caused, and thereby the element-group formation substrate 30 is divided into plural light-emitting chips 10.

In the present exemplary embodiment, first, the blade is successively pressed against the element-group formation substrate 30 shown in FIGS. 7A to 7C along each of the plural second modified regions 52. This causes cracks starting on the second modified regions 52, and thereby the element-group formation substrate 30 is cut in rectangles along the A-plane of the sapphire single crystal constituting the substrate 11.

Subsequently, the blade is successively pressed against the element-group formation substrate 30, which has been cut in the rectangles along the A-plane of the sapphire single crystal, along each of the plural first modified regions 51. This causes cracks starting on the first modified regions 51, and extends the cracks to the dividing grooves 41, and thereby the element-group formation substrate 30 is cut along the M-plane of the sapphire single crystal.

By undergoing each of the above-described processes, the light-emitting chip 10 shown in FIG. 1 can be obtained.

As described so far, in the present exemplary embodiment, in the element-group formation substrate 30, the dividing grooves 41 are formed to overlap the first groove portions 321 in the direction parallel to the M-plane of the sapphire single crystal constituting the substrate 11, and the first modified regions 51 are formed to overlap the dividing grooves 41. Consequently, in dividing the element-group formation substrate 30, the cracks caused to start on the first modified regions 51 reach the dividing grooves 41, and thereby the possibility that the cut surfaces extend off the first groove portions 321 and reach the light-emitting elements 31 can be suppressed. In other words, it becomes possible to suppress inclination of the first substrate side surface 111 of the light-emitting chip 10 with respect to the substrate front surface 11a. Further, this makes it possible to suppress occurrence of cracking in the semiconductor light-emitting elements 31 and generation of defective light-emitting chips 10.

On the other hand, the cut surfaces generated by the division along the A-plane of the sapphire single crystal (second substrate side surface 112) have tendency to be hardly inclined with respect to the direction perpendicular to the substrate front surface 11a compared to the cut surfaces generated by the division along the M-plane (first substrate side surface 111). Accordingly, in the element-group formation substrate 30, the second modified regions 52 are formed to overlap the second groove portions 322 in the direction parallel to the A-plane of the sapphire single crystal constituting the substrate 11, but the dividing grooves need not be provided. Consequently, it is sufficient to form the dividing grooves 41 along the M-plane of the sapphire single crystal, and thereby the production process can be simplified compared to the case where the dividing grooves are formed along both of the M-plane and the A-plane.

Further, in the case of forming the dividing grooves by a laser method, there is a possibility that soil flying as laser irradiation is performed is adhered to the surface of the laminated semiconductor layer 15, and thereby the electrical properties of the light-emitting chip 10 are deteriorated. However, in the present exemplary embodiment, since the dividing grooves 41 are formed in the direction along the M-plane of the sapphire single crystal, and not formed in the direction along the A-plane, it is possible to suppress adhesion of the soil flying with laser irradiation to the surface of the laminated semiconductor layer 15, and accordingly, it is possible to suppress deterioration of the electrical properties of the light-emitting chip 10.

It should be noted that, in the exemplary embodiment, the first modified regions 51 along the M-plane of the sapphire single crystal constituting the substrate 11 are formed after the second modified regions 52 along the A-plane are formed, however, the second modified regions 52 may be formed after the first modified regions 51 are formed. In this case, it is preferable to form the first modified regions 51 and the second modified regions 52 so that the first depth D1 becomes larger than the second depth D2 (D1>D2).

Further, in the present exemplary embodiment, the shape of the light-emitting chip 10 as viewed from above the substrate front surface 11a is a rectangle in which the direction along the M-plane of the sapphire single crystal constituting the substrate 11 is assumed to be a long side, and the direction along the A-plane is assumed to be a short side (c1>c2), however, the shape of the light-emitting chip 10 is not limited thereto.

FIGS. 8A to 8C are diagrams showing other configuration examples of the element-group formation substrate 30.

The shape of the light-emitting chip 10 as viewed from above the substrate front surface 11a may be, as shown in FIG. 8A, a square in which the first length c1 and the second length c2 are the same length. In this case, the first groove portions 321 and the second groove portions 322 may be formed so that the interval between the adjacent first groove portions 321 and the interval between the adjacent second groove portions 322 are substantially equal.

Further, the shape of the light-emitting chip 10 as viewed from above the substrate front surface 11a may be, as shown in FIG. 8B, a rectangle in which the second length c2 is longer than the first length c1. In this case, the first groove portions 321 and the second groove portions 322 may be formed so that the interval between the adjacent first groove portions 321 becomes longer than the interval between the adjacent second groove portions 322.

Further, in the present exemplary embodiment, the second groove portions 322 and the second modified regions 52 are provided in parallel with the A-plane of the sapphire single crystal constituting the substrate 11, however, not limited thereto and may be formed in any direction different from the direction along the M-plane. In other words, as shown in FIG. 8C, the shape of the light-emitting chip 10 as viewed from above the substrate front surface 11a may be a parallelogram, or, though not shown in the figure, the shape may be a trapezoid in which the directions along the M-plane of the sapphire single crystal are assumed to be an upper base and a lower base.

EXAMPLES

Hereinafter, the present invention will be specifically described based on the examples. However, the present invention is not limited to these examples.

The present inventors produced the element-group formation substrates 30 with different processing conditions regarding the groove portions 32 and the dividing grooves 41, and studied an incidence of defective cases (NG) of the light-emitting chips 10 produced by dividing the obtained element-group formation substrates 30.

It should be noted that, according to a method disclosed by a Japanese Patent Application Laid-Open Publication No. 2009-123717, the light-emitting chips 10 were produced by performing the dividing groove forming process, the modified region forming process and the dividing process after the element-group formation substrates 30, in each of which the semiconductor light-emitting elements 31 were formed on a sapphire substrate, were produced.

FIG. 9 is a diagram showing relationship among the processing conditions of the element-group formation substrate 30, configuration of the light-emitting chip 10 obtained by dividing the element-group formation substrate 30 having been subjected to processing and results of division of the element-group formation substrate 30 having been subjected to processing in Examples 1 to 5 and Comparative examples 1 and 2.

In FIG. 9, as the processing conditions of the element-group formation substrate 30, the width n1 of the first groove portion 321 and the width n2 of the second groove portion n2, presence or absence of the dividing grooves 41 and the depth of the dividing groove 41, and the first depth D1 where the first modified regions 51 are formed and the second depth D2 where the second modified regions 52 are formed are shown.

Moreover, in FIG. 9, as the configuration of the obtained light-emitting chip 10, the thickness of the light-emitting chip 10, in which the thickness of the semiconductor layer 15 and the thickness of the substrate 11 are added, and the first length c1 and the second length c2 in the light-emitting chip 10 are shown.

Further, as the results of division of the element-group formation substrate 30, the incidence of defective (NG) cases in the light-emitting chips 10 formed by dividing the element-group formation substrate 30 is shown.

It should be noted that a defective (NG) case referred to a light-emitting chip 10 in which a reverse current Ir is 2 µA or more when a reverse voltage Vr of 5V is applied, and a ratio of occurrence of the defective (NG) cases to 10000 light-emitting chips 10 was assumed to be the incidence of the defective (NG) cases.

When the element-group formation substrate 30 is divided to form the light-emitting chips 10, if the cracks occur in the semiconductor light-emitting element 31 due to damage caused by laser irradiation in the modified region forming process or mechanical damage caused in the dividing process, the damaged portion in the semiconductor light-emitting element 31 or fractured pieces adhered to the semiconductor layer behaves as a current path, and accordingly, the reverse current is increased. Consequently, it is possible to evaluate the cracks in the semiconductor light-emitting element 31 with high sensitivity based on the reverse current properties.

In Examples 1 to 5 and Comparative example 1 and 2, the semiconductor lamination substrate 20 was formed according to the procedures described in the semiconductor lamination process (step 101) of the exemplary embodiment.

Thereafter, according to the procedures described in the element-group forming process (step 102) of the exemplary embodiment, the first groove portions 321 and the second groove portions 322 were formed, and the p-electrode 16a and the n-electrode 16b were formed at the predetermined positions on the semiconductor layer 15, and then the substrate back surface 11b was ground and polished to obtain the element-group formation substrate 30.

Here, in Examples 1, 4 and 5, the width n1 of the first groove portion 321 was set to 20 µm and the width n2 of the second groove portion 322 was set to 30 µm. On the other hand, in Example 2 and Comparative example 1, both of the width n1 of the first groove portion 321 and the width n2 of the second groove portion 322 were set to 20 µm. Moreover, in Example 3 and Comparative example 2, both of the width n1 of the first groove portion 321 and the width n2 of the second groove portion 322 were set to 30 µm. Further, grinding and polishing were performed so that the thickness of the element-group formation substrate 30, in which the thickness of the semiconductor layer 15 and the thickness of the substrate 11 were added, became 150 µm.

Subsequently, in Examples 1 to 5, the dividing grooves 41 were formed on the element-group formation substrate 30 according to the procedures described in the dividing groove forming process (step 103) of the exemplary embodiment. Here, the depth of the dividing groove 41 was set to the same as the condition indicated in FIG. 9.

After the dividing grooves 41 were formed, the second modified regions 52 and the first modified regions 51 were formed according to the procedures described in the second modified region forming process (step 104) and the first modified region forming process (step 105) of the exemplary embodiment. It should be noted that the first depth D1 of the first modified regions 51 was set to 30 µm, and the second depth D2 of the second modified regions 52 was set to 100 µm.

After the first modified regions 51 and the second modified regions 52 were formed, according to the procedures described in the dividing process (step 106) of the exemplary embodiment, the element-group formation substrate 30 was divided into the plural light-emitting chips 10.

The light-emitting chip 10 obtained in Examples 1, 2 and 3 had the first length c1 of 400 µm and the second length c2 of 240 µm, and the shape of the light-emitting chip 10 as viewed from the substrate front surface 11a was a rectangle in which the direction along the M-plane of the sapphire single crystal constituting the substrate 11 was assumed to be a long side.

Further, the light-emitting chip 10 obtained in Example 4 had the first length c1 of 350 µm and the second length c2 of 350 µm also, and the shape of the light-emitting chip 10 as viewed from the substrate front surface 11a was a square.

Still further, the light-emitting chip 10 obtained in Example 5 had the first length c1 of 240 µm and the second length c2 of 400 µm, and the shape of the light-emitting chip 10 as viewed from the substrate front surface 11a was a rectangle in which the direction along the A-plane of the sapphire single crystal constituting the substrate 11 was assumed to be a long side.

On the other hand, in Comparative examples 1 and 2, the light-emitting chip 10 was obtained by performing the processes similar to those in Examples 1 to 5 except for a point that the dividing groove forming process in step 103 was not performed and the dividing grooves 41 were not formed. The light-emitting chip 10 obtained in the Comparative examples 1 and 2 had the first length c1 of 400 µm and the second length c2 of 240 µm, and the shape of the light-emitting chip 10 as viewed from the substrate front surface 11a was a rectangle in which the direction along the M-plane of the sapphire single crystal constituting the substrate 11 was assumed to be a long side.

Next, the results of division of the element-group formation substrate 30 will be described.

First, in Examples 1 to 5, the incidence of the defective (NG) cases in the light-emitting chip 10 obtained by dividing the element-group formation substrate 30 was 0.5% or less.

On the other hand, in both of Comparative examples 1 and 2, the incidence of the defective (NG) cases in the light-emitting chip 10 was 1% or more; therefore, it was learned that the defective light-emitting chip 10 is apt to be generated compared to Examples 1 to 5.

From above, it can be seen that, by providing the dividing grooves 41 so as to overlap the first groove portions 321 on the element-group formation substrate 30, it becomes possible to suppress inclination of the cut surface with respect to the M-plane of the sapphire single crystal when the element-group formation substrate 30 is divided, and thereby suppress the occurrence of the defective light-emitting chips 10. Further, it can be understood that the occurrence of the defective light-emitting chips 10 can be suppressed even though the dividing grooves are not provided on the side of the second groove portions 322.

Subsequently, Example 2 and Comparative example 1 will be compared. Example 2 and Comparative example 1 indicate a relationship in the case where both of the width n1 of the first groove portion 321 and the width n2 of the second groove portion 322 are 20 μm, and a difference exists in the point of presence or absence of the dividing grooves 41.

While the incidence of the cases of defective appearance (NG) was 0.45% in Example 2, the incidence of the cases of defective appearance (NG) was 9.50% in Comparative example 1. Accordingly, in the case where both of the width n1 of the first groove portion 321 and the width n2 of the second groove portion 322 were 20 μm, by providing the dividing grooves 41, the incidence of the cases of defective appearance (NG) was reduced and favorable results were obtained.

In a similar way, Example 3 and Comparative example 2 will be compared. Example 3 and Comparative example 2 indicate a relationship in the case where both of the width n1 of the first groove portion 321 and the width n2 of the second groove portion 322 are 30 μm, and a difference exists in the point of presence or absence of the dividing grooves 41.

While the incidence of the cases of defective appearance (NG) was 0.40% in Example 3, the incidence of the cases of defective appearance (NG) was 1.20% in Comparative example 2. Accordingly, in the case where both of the width n1 of the first groove portion 321 and the width n2 of the second groove portion 322 were 30 μm, by providing the dividing grooves 41, the incidence of the cases of defective appearance (NG) was reduced and favorable results were obtained.

Next, Example 1 and Comparative example 2 will be compared. Example 1 and Comparative example 2 indicate a relationship in the case where the width n1 of the first groove portion 321 is varied, and a difference exists in the point of presence or absence of the dividing grooves 41.

As the incidence of the defective (NG) cases in Example 1 (0.15%) is compared with the incidence of the defective (NG) cases in Comparative example 2 (1.20%), the incidence of the defective (NG) cases in Example 1 is low. Accordingly, it was learned that the incidence of the defective (NG) cases was reduced in the case where the width n1 of the first groove portion 321 was reduced as well as the dividing grooves 41 were provided to the first groove portions 321 compared to the case where the width n1 of the first groove portion 321 was increased without providing the dividing grooves 41 to the first groove portions 321.

Subsequently, Example 1 and Example 2 will be compared. Example 1 and Example 2 indicate a relationship in the case where the dividing grooves 41 are provided and the width n2 of the second groove portion 322 is varied.

As the incidence of the defective (NG) cases in Example 1 (0.15%) is compared with the incidence of the defective (NG) cases in Example 2 (0.45%), the incidence of the defective (NG) cases in Example 1 is low. Accordingly, it was learned that the incidence of the defective (NG) cases was reduced by setting the width n2 of the second groove portion 322 larger than the width n1 of the first groove portion 321 (n1<n2) in the case where the dividing grooves 41 were provided to the first groove portions 321.

On the other hand, in Example 2, compared to Example 1, the width n2 of the second groove portion 322 is narrow, and therefore, intervals among the plural semiconductor light-emitting elements 31 formed on the element-group formation substrate 30 become narrow. In other words, in Example 2, the number of the semiconductor light-emitting elements 31 formed on a single element-group formation substrate 30 is larger than that in the case of Example 1. Consequently, in consideration of the number of non-defective light-emitting chips 10 among the light-emitting chips 10 obtained from a single element-group formation substrate 30, it can be said that favorable results were obtained in both Example 1 and Example 2.

Next, Example 1 and Example 3 will be compared. Example 1 and Example 3 indicate a relationship in the case where the dividing grooves 41 are provided and the width n1 of the first groove portion 321 is varied.

As the incidence of the defective (NG) cases in Example 1 (0.15%) is compared with the incidence of the defective (NG) cases in Example 3 (0.40%), the incidence of the defective (NG) cases in Example 1 is low.

Accordingly, it was learned that the incidence of the defective (NG) cases was reduced by setting the width n1 of the first groove portion 321 smaller than the width n2 of the second groove portion 322 (n1<n2) in the case where the dividing grooves 41 were provided to the first groove portions 321.

Further subsequently, Examples 1, 4 and 5 will be compared. Examples 1, 4 and 5 indicate a relationship in the case where the dividing grooves 41 are provided and the first length c1 and the second length c2 are varied, that is, the shape of the light-emitting chip 10 as viewed from the substrate front surface 11a is varied.

As the incidence of the defective (NG) cases in Example 1 (0.15%), the incidence of the defective (NG) cases in Example 4 (0.30%) and the incidence of the defective (NG) cases in Example 5 (0.25%) are compared with each other, the incidence of the defective (NG) cases in Example 1 is low.

Accordingly, it was learned that the incidence of the defective (NG) cases was reduced by putting the shape of the light-emitting chip 10 as viewed from the substrate front surface 11a into a rectangle in which the direction along the M-plane of the sapphire single crystal constituting the substrate 11 is assumed to be a long side, in the case where the dividing grooves 41 were provided to the first groove portions 321.

It should be noted that, though details are omitted, in the case of forming the dividing grooves 41 in the directions along both of the first groove portions 321 and the second groove portions 322 using a laser method, it was necessary to perform a process, such as protecting film formation, when the dividing grooves 41 were formed along the second groove portions 322, in addition to the occasion of forming the dividing grooves 41 along the first groove portions 321, and therefore, there was a cost increase in comparison with Examples 1 to 5.

The foregoing description of the exemplary embodiment of the present invention has been provided for the purposes of illustration and description. It is not intended to be exhaustive or to limit the invention to the precise forms disclosed. Obviously, many modifications and variations will be apparent to practitioners skilled in the art. The exemplary embodiment was chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A method for producing a semiconductor light-emitting chip, comprising:
    a dividing groove forming process for forming a plurality of dividing grooves on a semiconductor lamination substrate, in which a semiconductor layer containing a group III nitride semiconductor is laminated on a front surface of a sapphire substrate having the front surface and a back surface, the front surface being composed of a C-plane of a sapphire single crystal constituting the sapphire substrate, the plurality of dividing grooves being formed in a first direction along an M-plane of the sapphire single crystal and the front surface of the sapphire substrate from a side on which the semiconductor layer is laminated;
    a modified region forming process for forming, in the sapphire substrate, a plurality of first modified regions extending toward the first direction and a plurality of second modified regions extending along the front surface of the sapphire substrate and toward a second direction different from the first direction by irradiating the semiconductor lamination substrate, on which the plurality of dividing grooves are formed, with laser light from a side of the back surface; and
    a dividing process for dividing the semiconductor lamination substrate, in which the plurality of first modified regions and the plurality of second modified regions are formed, by use of the plurality of first modified regions and the plurality of second modified regions,
    wherein, in the dividing groove forming process, any dividing groove extending toward the second direction is not formed on the semiconductor lamination substrate from the side on which the semiconductor layer is laminated.

2. The method for producing a semiconductor light-emitting chip according to claim 1, further comprising:
    a groove portion forming process for forming a plurality of first groove portions extending toward the first direction and a plurality of second groove portions extending toward the second direction on the semiconductor layer by removing part of the semiconductor layer along the first direction and the second direction from the side on which the semiconductor layer is laminated, the groove portion forming process being prior to the dividing groove forming process,
    wherein, in the dividing groove forming process, each of the plurality of dividing grooves is formed in each of the plurality of first groove portions, and
    in the modified region forming process, each of the plurality of first modified regions is formed to overlap each of the plurality of first groove portions in a depth direction of the sapphire substrate by performing irradiation of the laser light along each of the plurality of first groove portions, and each of the plurality of second modified regions is formed to overlap each of the plurality of second groove portions in the depth direction of the sapphire substrate by performing irradiation of the laser light along each of the plurality of second groove portions.

3. The method for producing a semiconductor light-emitting chip according to claim 2, wherein the modified region forming process comprises:
    a second modified region forming process for forming the plurality of second modified regions in the semiconductor lamination substrate on which the plurality of dividing grooves have been formed; and
    a first modified region forming process for forming the plurality of first modified regions in the semiconductor lamination substrate in which the plurality of second modified regions have been formed,
    the second modified region forming process and the first modified region forming process being performed in this order.

4. The method for producing a semiconductor light-emitting chip according to claim 3, wherein, in the modified region forming process, each of the plurality of second modified regions is formed at a position whose depth from the back surface of the sapphire substrate is a second depth, and each of the plurality of first modified regions is formed at a position whose depth from the back surface of the sapphire substrate is a first depth that is shallower than the second depth.

5. The method for producing a semiconductor light-emitting chip according to claim 4, wherein, in the modified region forming process, intensity of the laser light in forming the plurality of first modified regions is set lower than intensity of the laser light in forming the plurality of second modified regions.

6. The method for producing a semiconductor light-emitting chip according to claim 5, wherein, in the modified region forming process, intervals between adjacent ones of the plurality of first modified regions are set closer than intervals between adjacent ones of the plurality of second modified regions.

7. The method for producing a semiconductor light-emitting chip according to claim 6, wherein, in the dividing process, the semiconductor lamination substrate in which the plurality of first modified regions and the plurality of second modified regions are formed is divided by use of the plurality of second modified regions, and thereafter, divided by use of the plurality of first modified regions.

8. The method for producing a semiconductor light-emitting chip according to claim 1, wherein the modified region forming process comprises:
    a second modified region forming process for forming the plurality of second modified regions in the semiconductor lamination substrate on which the plurality of dividing grooves have been formed; and
    a first modified region forming process for forming the plurality of first modified regions in the semiconductor lamination substrate in which the plurality of second modified regions have been formed,
    the second modified region forming process and the first modified region forming process being performed in this order.

9. The method for producing a semiconductor light-emitting chip according to claim 1, wherein, in the modified region forming process, each of the plurality of second modified regions is formed at a position whose depth from the back surface of the sapphire substrate is a second depth, and each of the plurality of first modified regions is formed at a position whose depth from the back surface of the sapphire substrate is a first depth that is shallower than the second depth.

10. The method for producing a semiconductor light-emitting chip according to claim 1, wherein, in the modified region forming process, intensity of the laser light in forming the plurality of first modified regions is set lower than intensity of the laser light in forming the plurality of second modified regions.

11. The method for producing a semiconductor light-emitting chip according to claim 1, wherein, in the modified region forming process, intervals between adjacent ones of the plurality of first modified regions are set closer than intervals between adjacent ones of the plurality of second modified regions.

12. The method for producing a semiconductor light-emitting chip according to claim 1, wherein, in the dividing process, the semiconductor lamination substrate in which the plurality of first modified regions and the plurality of second modified regions are formed is divided by use of the plurality of second modified regions, and thereafter, divided by use of the plurality of first modified regions.

* * * * *